(12) United States Patent
Kim et al.

(10) Patent No.: US 11,087,952 B2
(45) Date of Patent: Aug. 10, 2021

(54) LINEAR STRUCTURE FOR DISPLACEMENT TRANSMISSION, AND ONE-DIMENSIONAL AND THREE-DIMENSIONAL MICRO MOVEMENT DEVICE USING SAME

(71) Applicant: KOREA RESEARCH INSTITUTE OF STANDARDS AND SCIENCE, Daejeon (KR)

(72) Inventors: Dal Hyun Kim, Daejeon (KR); Byong Chon Park, Daejeon (KR); Chae Ho Shin, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 523 days.

(21) Appl. No.: 16/067,564

(22) PCT Filed: Dec. 29, 2016

(86) PCT No.: PCT/KR2016/015456
§ 371 (c)(1),
(2) Date: Jun. 29, 2018

(87) PCT Pub. No.: WO2017/116155
PCT Pub. Date: Jul. 6, 2017

(65) Prior Publication Data
US 2019/0006144 A1    Jan. 3, 2019

(30) Foreign Application Priority Data
Dec. 31, 2015 (KR) .................. 10-2015-0190647

(51) Int. Cl.
*H01J 37/20* (2006.01)
*H01L 41/00* (2013.01)
(Continued)

(52) U.S. Cl.
CPC .............. *H01J 37/20* (2013.01); *G01Q 10/04* (2013.01); *H01L 41/00* (2013.01); *H02N 2/026* (2013.01);
(Continued)

(58) Field of Classification Search
CPC ........ H02N 2/026; H02N 2/028; H02N 2/043; H01J 37/20; H01J 2237/20264; H01L 41/00; G01Q 10/04; G02B 21/26
See application file for complete search history.

(56) References Cited

U.S. PATENT DOCUMENTS

2016/0011231 A1* 1/2016 Shigeno ................. G01Q 70/04
850/3

FOREIGN PATENT DOCUMENTS

| JP | 3-35104 A | 2/1991 |
|---|---|---|
| JP | 8-334519 A | 12/1996 |

(Continued)

OTHER PUBLICATIONS

International Search Report of PCT/KR2016/015456 which is the parent application and its English translation—4 pages dated Mar. 31, 2017.

*Primary Examiner* — Emily P Pham
(74) *Attorney, Agent, or Firm* — Knobbe Martens Olson & Bear LLP (57) ABSTRACT

Provided is a linear structure for displacement transmission that can be bent in a second direction or a third direction when force in the second direction or the third direction is applied and can transmit a displacement in a first direction from an end of one side to an end of the other side when force in the first direction is applied. The linear structure includes a displacement transmission plate and a plurality of displacement transmission rods disposed radially on the displacement transmission plate to transmit the displace- (Continued)

ment in the first direction from the end of one side to the end of the other side.

15 Claims, 8 Drawing Sheets

(51) Int. Cl.
  *G01Q 10/04* (2010.01)
  *H02N 2/02* (2006.01)
  *H02N 2/04* (2006.01)
  *G02B 21/26* (2006.01)
(52) U.S. Cl.
  CPC ............. *H02N 2/028* (2013.01); *H02N 2/043* (2013.01); *G02B 21/26* (2013.01); *H01J 2237/20264* (2013.01)

(56) References Cited

FOREIGN PATENT DOCUMENTS

| KR | 10-1998-0065084 A | 10/1998 |
| KR | 10-2007-0085764 A | 8/2007 |
| KR | 10-2007-0086874 A | 8/2007 |
| KR | 10-2010-0073519 A | 7/2010 |
| KR | 10-2012-0019299 A | 3/2012 |

\* cited by examiner

LINEAR STRUCTURE FOR DISPLACEMENT TRANSMISSION, AND ONE-DIMENSIONAL AND THREE-DIMENSIONAL MICRO MOVEMENT DEVICE USING SAME

TECHNICAL FIELD

The present invention relates to a linear structure for displacement transmission and a one-dimensional and three-dimensional micro movement device using the same, and more particularly, to a linear structure for displacement transmission having a structure that enables a desired movement to be performed smoothly while minimizing complexity of a system through a simple structure in performing a precise and fine movement, and a one-dimensional and three-dimensional micro movement device using the same.

In general, scanning microscopes such as an atomic force microscope (AFM), a scanning tunneling microscope (STM), and the like, electron/ion beam microscopes such as a scanning electron microscope (SEM)/focused ion beam (FIB) and the like, and micro machining devices such as a micro 3D printer and the like include a compact and lightweight head directly used for observation/machining, and a stage on which an object to be observed/machined is disposed. In this case, while the head or the stage is appropriately moved two-dimensionally or three-dimensionally relative to each other, the observation or the machining is performed. In order to implement the two-dimensional or three-dimensional movement, at least one of the head and the stage is equipped with a movement device that moves the head and the stage, and the movement device is usually called a scanner. In more detail, a microscope device or a micro machining device is separately equipped with a device for moving a relatively large distance and a device for moving a relatively small distance. For example, in order to move the relatively large distance, an observing/machining part including the head or the stage itself may be equipped with actuators including linear or rotary motors, mechanical structures, and the like so that they may move in a two-dimensional or three-dimensional direction. Meanwhile, in order to implement a micro level movement which is relatively smaller than the distance moved by the actuators, a micro movement device may be separately provided to the head or a micro movement stage may be separately provided on the stage.

BACKGROUND ART

The scanner for three-dimensional micro movement as described above generally implements a three-dimensional movement by three one-dimensional scanners provided in three directions, or an appropriate combination of a one-dimensional scanner and a two-dimensional scanner. However, since an existing scanner having the above-mentioned structure should be installed by stacking at least two or more scanners, there is a problem that a resonance frequency of the scanner stacked on a lower portion is reduced due to a weight of the scanner stacked on an upper portion which results in deterioration of dynamic characteristics and lowering a scan speed limit.

Meanwhile, as structure for implementing a three-dimensional micro movement, a technology of applying a flexure structure is also disclosed. The flexure structure is a structure in which a spring constant in one direction is relatively very large as compared to the spring constant in another direction, and has characteristic that when force is applied thereto, a movement in the direction having the large spring constant is limited and the movement occurs only in the direction having the small spring constant. An example of the simplest flexure structure may be a structure which is formed with a constant thickness and width as a whole and has the form of a bar extending in a length direction and in which a narrow region of a portion of the thickness or the width thereof is very thin. When force is externally applied to the bar, a shape deformation does not occur in a portion having the constant thickness and width and the shape deformation occurs only in a region in which the thickness or the width is thin, and as a result, only a rotational motion about the corresponding region occurs. When a pair of bars having a pair of rotary joints by the flexure structure at both ends thereof are connected so that the ends of one side are connected to each other as fixing ends and the ends of the other side are connected to each other as moving ends, a four-joint link structure having four rotary joints are formed, and when such a link structure is externally applied with force, it moves along only a trajectory which is determined in advance according to length of the bars, positions of the rotary joints, and the like.

Since the above-mentioned flexure structure does not include a separate bearing in the rotary joint as described above, it does not cause frictional force and allows the link structure to be moved only in a predetermined direction, in other words, serves to limit and guide a direction of the motion. Accordingly, since the flexure structure may implement a very stable motion within an elastic deformation range of the flexure, the flexure structure is well used in a device for implementing a micro motion. Various examples of micro movement devices using a flexure structure and a piezoelectric driver (for applying force) as described above are disclosed in Korean Patent Laid-Open Publication No. 2012-0019299 ("Linear Stage with Flexure to Absorb Deformation Such As Heat-Induced Deformation" published on Mar. 6, 2012), Korean Patent Laid-Open Publication No. 2007-0085764 ("Fine Stage Z Support Apparatus" published on May 18, 2006), Korean Patent Laid-Open Publication No. 1998-0065084 ("Ultra-Precision Three-Axis Stage for Use of Atomic Force Microscopy" published on Oct. 7, 1998), and the like.

In a case in which the flexure structure is applied to the scanner, there is an advantage in that a fairly heavy object may also be scanned. However, in a case in which the light head of the microscope device or a light sample as described is intended to be finely moved, since the head or the sample itself is significantly lightweight, the above-mentioned advantage of the flexure structure does not act advantageously. In addition, in order to implement the flexure structure, in precisely machining a complex shape such as the flexure structure or the like through an electric discharging machining as well as a milling/lathe machining, there is a problem that a precision machining is required, and the number, cost, and time of the machining process increase. Further, there are following problems in terms of dynamic characteristics. As described above, the motion of the flexure structure is determined according to the spring constants of the corresponding flexure structure and the dynamic characteristics thereof are influenced by variables such as the weight and the specification of the corresponding flexure structure itself. However, the spring constant of the flexure structure itself is generally greater than that of the actuator (a driving part) of the scanner formed in the form of the piezoelectric driver, and a spring system in which a moving part supported by the spring is moved by the driving part is formed. As a result, a resonance frequency of the scanner becomes lower than a resonance frequency of the actuator of the scanner according to the spring constant and a problem in which the resonance frequency is reduced and the scan speed is deteriorated occurs in the same manner. As described above, when the three-axis scanner is configured by stacking a plurality of scanners, since another axis is stacked on one axis to cause an increase in the weight of the moving part, a scan speed is reduced, or in a structure in which the driving part of each axis is in mechanical contact with and connected to one moving part, since the movement of the moving part to one axis is interfered by the driving part of another axis, the speed is reduced. However, even with the application of the flexure structure as described above, there was a limit to completely solve the above-mentioned problems.

In order to solve the above-mentioned problems, a demand for a new structure of three-dimensional micro movement device has been continuously demanded.

RELATED ART DOCUMENT

Patent Document

1. Korean Patent Laid-Open Publication No. 2012-0019299 ("Linear Stage with Flexure to Absorb Deformation Such As Heat-Induced Deformation" published on Mar. 6, 2012)
2. Korean Patent Laid-Open Publication No. 2007-0085764 ("Fine Stage Z Support Apparatus" published on May 18, 2006)
3. Korean Patent Laid-Open Publication No. 1998-0065084 ("Ultra-Precision Three-Axis Stage for Use of Atomic Force Microscopy" published on Oct. 7, 1998)

DISCLOSURE

Technical Solution

As shown in FIGS. 1-13, an aspect of the present invention is to provide a linear structure for displacement transmission having a structure that enables a desired movement to be performed smoothly while minimizing complexity of a system through a simple structure in performing a precise and fine movement, and a one-dimensional and three-dimensional movement device using the same.

In one general aspect, referring to FIGS. 1-4, there is provided a linear structure 110 for displacement transmission in which a spring constant in a second direction and a third direction which are perpendicular to a first direction is formed to be negligibly smaller than the spring constant in the first direction (when it is assumed that a scan direction is the first direction) such that the linear structure for displacement transmission is immediately bent in the second direction or the third direction without resistance when force in the second direction or the third direction is applied and transmits a displacement in the first direction from an end of one side to an end of the other side without being bent when force in the first direction is applied, the linear structure 110 for displacement transmission includes a displacement transmission plate 111 formed in a surface shape and disposed on a plane in the second direction and the third direction; and a plurality of displacement transmission rods 112 formed in a linear shape extended in the first direction and having ends of one side connected to the displacement transmission plate 111, wherein the plurality of displacement transmission rods 112 are disposed radially on the displacement transmission plate 111 to transmit the displacement in the first direction from the end of one side to the end of the other side.

Referring to FIGS. 1-4, the linear structure 110 for displacement transmission may be formed so that a ratio of an equivalent diameter of a cross section to a length of the displacement transmission rod 112 is within the range of 1 to 10%, and the displacement transmitted by the linear structure 110 for displacement transmission may be within the range of 0.001 to 1% of the length of the displacement transmission rod 112. The length of the displacement transmission rod 112 may be within the range of several to several tens mm.

Referring to FIGS. 1-4, the displacement transmission rod 112 may be formed in at least one form selected from a rod shape in which an interior is tightly filled, a pipe shape in which an interior is empty, and a spring.

Figure 4:
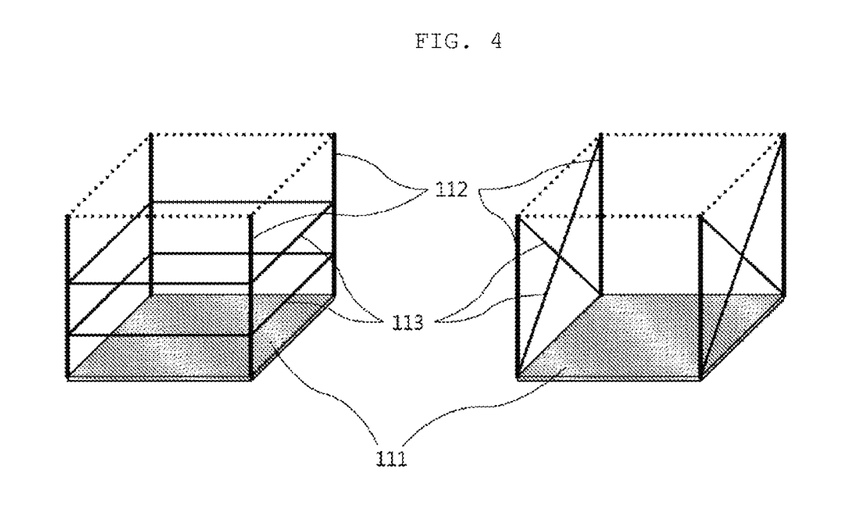
FIG. 4 shows various examples of a stiffener of the linear structure for displacement transmission according to the present invention.

Referring to FIG. 4, the linear structure 110 for displacement transmission may further include a stiffener 113 formed between the plurality of displacement transmission rods 112 so that rigidity of the linear structure 110 for displacement transmission is reinforced or the spring constant in a predetermined specific direction is increased. A plurality of stiffeners 113 may be formed in a linear shape and be disposed to be parallel to each other or disposed in an X shape, or be formed in a surface shape and be provided between at least one pair of displacement transmission rods 112 selected from the plurality of displacement transmission rods 112.

In another general aspect, referring to FIGS. 5-8, there is provided a one-dimensional micro movement device including: a linear structure 110 for displacement transmission formed as described above; and a driving part 120 having an upper surface and a lower surface which are disposed to be parallel to a plane in a second direction and a third direction and deformed to be stretched and contracted in a first direction by forming any one surface selected from the upper surface and the lower surface as a fixing end and forming the other surface as a moving end, wherein the linear structure 110 for displacement transmission is provided to the moving end of the driving part 120.

Referring to FIGS. 5-8, the driving part 120 may be various driving devices such as a piezoelectric actuator or an electromagnet driver. When the driving part 120 is the electromagnet driver, a magnetic substance may be separately included in the displacement transmission plate 111, or the displacement transmission plate 111 itself may be formed of a magnetic material. When the driving part 120 is the piezoelectric actuator, the driving part 120 may be formed by arranging a plurality of piezoelectric elements which are stretched and contracted in the first direction to be parallel to each other on a plane of the second direction and the third direction.

Figure 7:
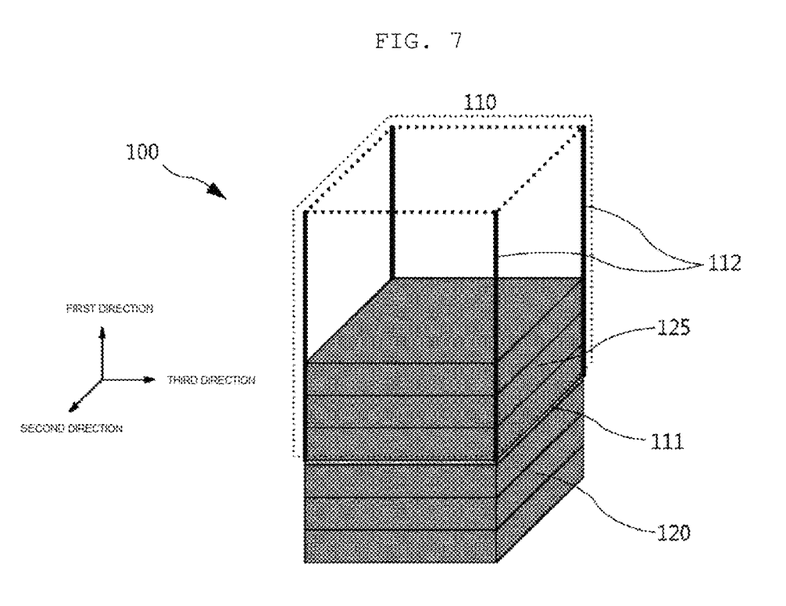
FIG. 7 shows another example of the one-dimensional micro movement device according to the present invention.

Referring to FIG. 7, the one-dimensional micro movement device 100 may further include an auxiliary driving part 125 having a fixing end and a moving end which are disposed in a direction opposite to the driving part 120. The one-dimensional micro movement device 100 may be formed so that the displacement transmission plate 111 is interposed between the driving part 120 and the auxiliary driving part 125.

Figure 8:
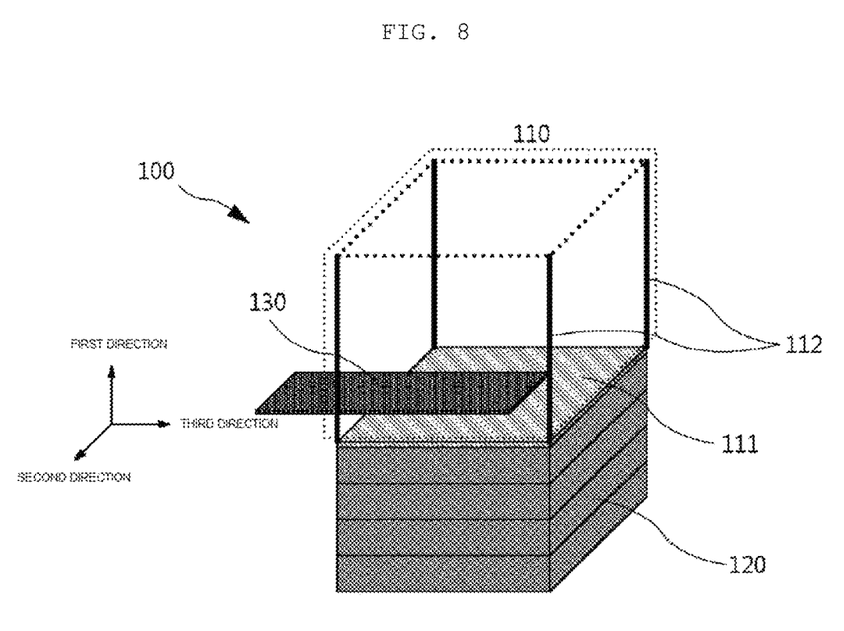
FIG. 8 shows still another example of the one-dimensional micro movement device according to the present invention.

Referring to FIG. 8, the one-dimensional micro movement device 100 may further include an elastic compressing part 130, which is an elastic body provided to the moving end of the driving part 120, and formed so that elastic force acts in a direction to compress the driving part 120 in the first direction.

Figure 9:
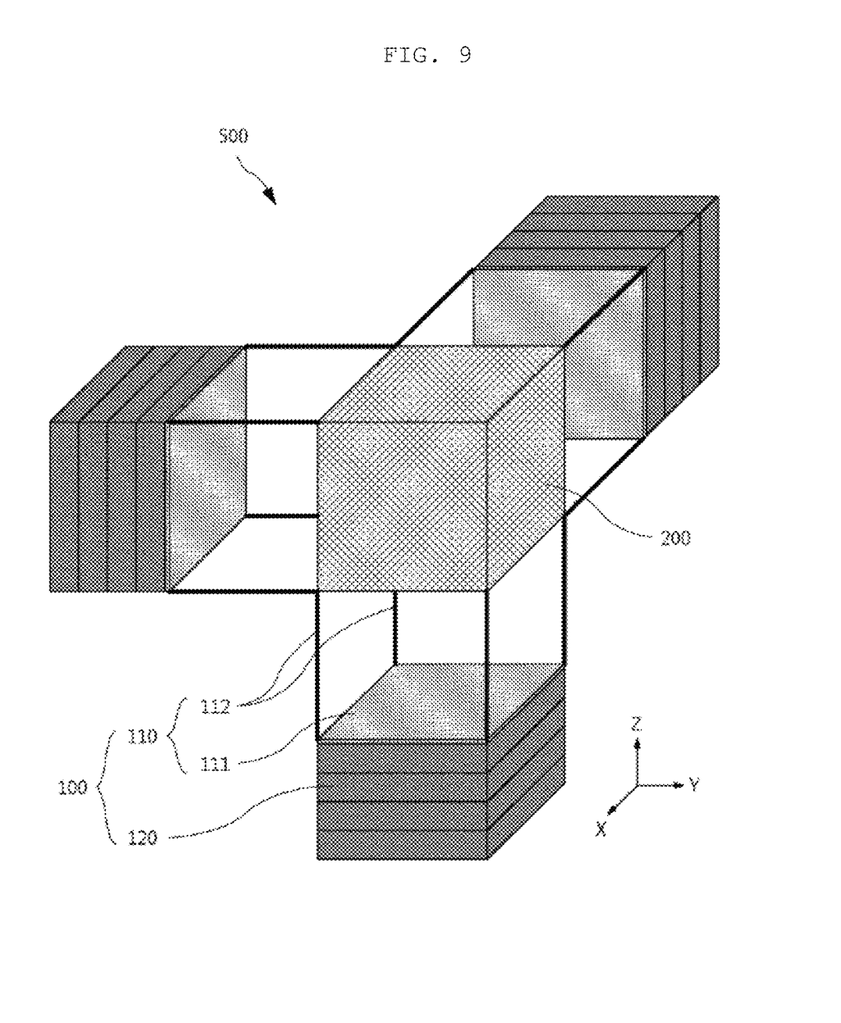
FIG. 9 shows an example of a three-dimensional micro movement device according to the present invention.
Figure 10:
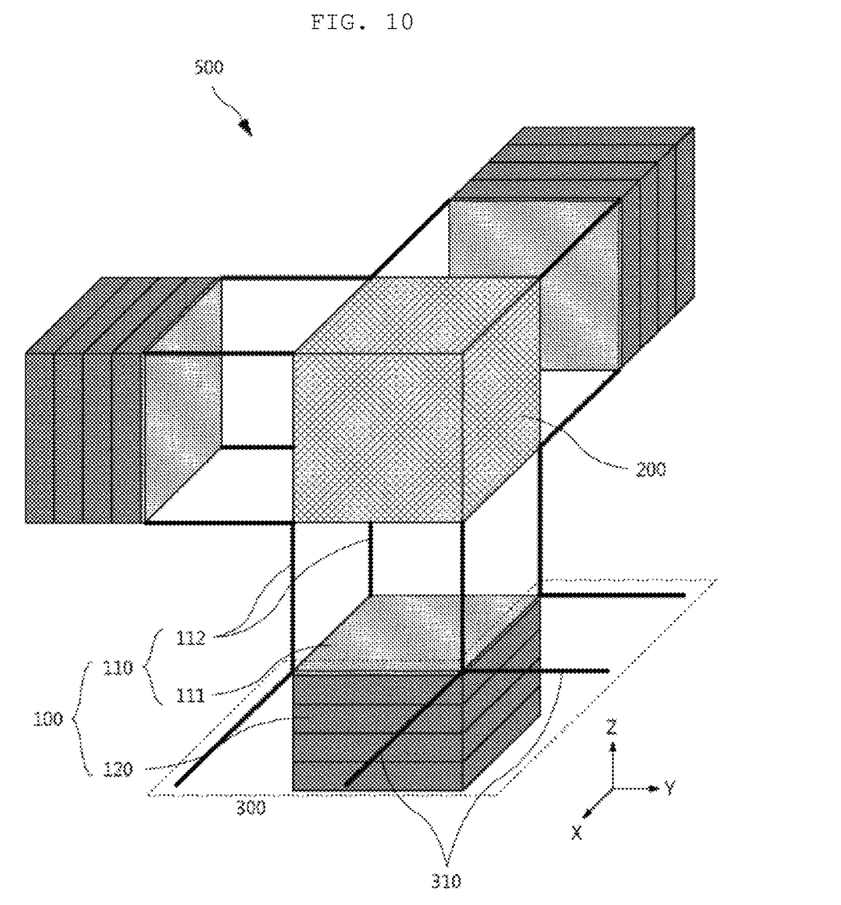
FIG. 10 shows another example of the three-dimensional micro movement device according to the present invention.
Figure 11:
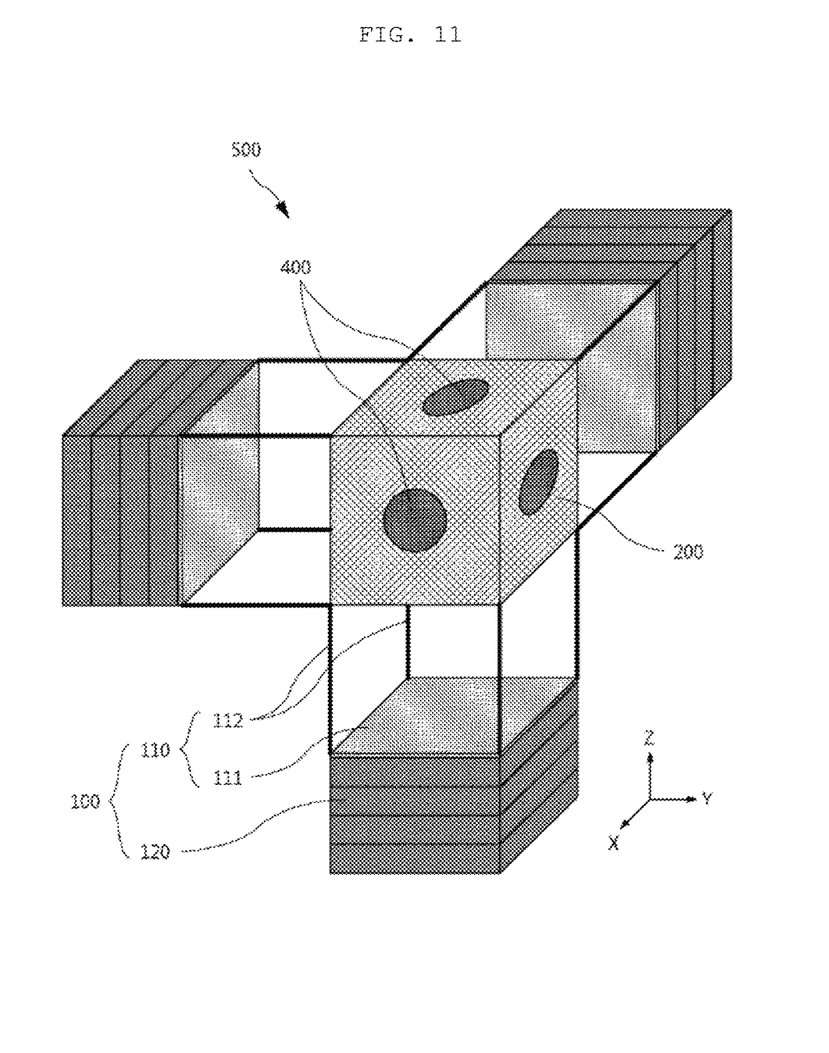
FIG. 11 shows still another example of the three-dimensional micro movement device according to the present invention.

In another general aspect, referring to FIGS. 9-11, there is provided a three-dimensional micro movement device 500 including a one-dimensional micro movement device 100 as described above, including: three one-dimensional micro movement devices 100 disposed in X, Y, and Z axis directions, respectively; and a moving part 200 to which the three one-dimensional micro movement devices 100 are directly connected, wherein the moving part 200 is movable in the X, Y, and Z axis directions by the three one-dimensional micro movement devices 100.

Referring to FIGS. 9-11, the three-dimensional micro movement device 500 may further include a linear structure 300 for support including a plurality of supporting rods 310 connected to the displacement transmission plate 111 of at least one one-dimensional micro movement device 100 selected from the one-dimensional micro movement devices 100, extended in a direction perpendicular to a displacement transmission direction of the selected one-dimensional micro movement device 100, and formed in a linear shape.

Referring to FIGS. 9-11, the three-dimensional micro movement device 500 may further include at least one sensor 400 provided to the moving part 200 and sensing a displacement in at least one direction selected from the X, Y, and Z axis directions of the moving part 200.

Advantageous Effects

According to the present invention, since the micro movement device is configured in a very simple structure, there is a great advantage that the micro movement device may be made much smaller and lighter, and may be manufactured at a lower cost as compared to the related art. In addition, a cost saving effect may be further improved since precision machining for forming a complex structure is not required as compared to the related art using the complex structure such as the flexure structure or the like. In addition, since the micro movement device may be manufactured integrally with the three-dimensional scanner or may be assembled by separately manufacturing the respective parts including the displacement transmission rod, and may manufacture the entire structure in a connection of a linear structure, the micro movement device may be very easily and fast manufactured using the three-dimensional printer machining, that is, manufacturing convenience thereof is very high. Above all, according to the present invention, since a disadvantage that a movement of one axis that moves the moving part is limited by another axis is minimized, the problem of the reduction of the resonance frequency and the lowering of the limitation of the scan speed of the micro movement device, and mutual interference and an influence between the axes may be solved.

In more detail, according to the related art, the flexure structure is adopted in the moving part of the micro movement device, or a structure in which the plurality of scanners are stacked is used. Since the flexure structure itself has a large weight and volume and a large spring constant, there is a problem that the resonance frequency of the micro movement device is significantly lowered than the resonance frequency of the driving part of the micro movement device. In addition, when another scanner is stacked on the micro movement device, the scan speed is decreased due to an increase in the weight of the moving part, and when the driving part of each axis is connected to one moving part, since inertial mass (a kind of effective mass) is increased due to a mechanical interaction with the driving part of another axis when the moving part scans with one axis, the scan speed is decreased and a motion of another axis is also influenced. However, since the present invention has a structure in which the moving part moves as the transition of one axis is transmitted through the linear structure for transition transmission and mechanical interference of other two axes is minimized, the effective mass of the moving part in the micro movement device may be much reduced as compared to the conventional flexure structure using a spring having a large spring constant. In addition, since the structure according to the present invention is the structure that removes the interference due to other two axes, the resonance frequency of the moving part of the micro movement device is not significantly reduced as compared with the resonance frequency of the driving part of the micro movement device. That is, according to the present invention, the problem of lowering the limitation of the scan speed due to the reduction in the resonance frequency according to the related art may be solved. In addition, since the transition of one axis does not influence other two axes which is perpendicular to one axis, mutual influence may be excluded. For example, in the case of the flexure stage, if a resonance of one axis occurs, resonance of other two axes also occur, but according to the present invention, the resonance of the corresponding axis does not propagate to other two axes. That is, according to the present invention, there is a great effect that the dynamic characteristics of the three-dimensional micro movement device as a whole are remarkably excellent as compared to the related art.

In addition, according to the present invention, as the three-dimensional micro movement device having excellent dynamic characteristics and small size and light weight is realized, the three-dimensional micro movement device is applied to a head of a device having a small head used for observation or machining, such as a scanning microscope such as AFM, STM, or the like, an electron/ion beam microscope such as SEM/FIB, or the like, a micro machining device such as a micro 3D printer, or the like, or more fine and precise scan is implemented for a small sample, thereby making it possible to realize more fine and precise observation or machining.

| [Detailed Description of Main Elements] | |
|---|---|
| 100: one-dimensional micro movement device | |
| 110: linear structure for displacement transmission | |
| 111: displacement transmission plate | |
| 112: displacement transmission rod | 113: stiffener |
| 120: driving part | 125: auxiliary driving part |
| 130: elastic compressing part | |
| 200: moving part | 300: linear structure for support |
| 310: supporting rod | 400: sensor |
| 500: three-dimensional micro movement device | |

BEST MODE

Hereinafter, a linear structure for displacement transmission according to the present invention having the configuration as described above and a one-dimensional and three-dimensional micro movement device using the same will be described in detail with reference to the accompanying drawings.

The present will be briefly described as follows. The present invention has been studied to solve the problems that when the flexure structure according to the related art is used, the structure is complex, it is difficult to manufacture the flexure structure, a machining is difficult because a precision machining/electric discharging machining is required, the number of processes is large, it is time consuming and costly, and dynamic characteristics are deteriorated or axes are mutually influenced due to a reduction of a resonance frequency by an inter-axis interference or interference between a spring structure and another axis. More specifically, the present invention intends to suggest a structure for displacement transmission capable of satisfying the following conditions.

it is necessary to be able to transmit a displacement in a specific direction generated by the driving part to the moving part without distortion it is necessary to remove inter-axis interference and to increase dynamic characteristics by minimizing resistance so that the structure for displacement transmission may be easily deformed in directions other than the specific direction when considering a three-dimensional movement it is necessary to be able to be miniaturized and lightened The present invention first suggests the structure for displacement transmission capable of satisfying the conditions as described above, suggests a one-dimensional micro movement device using the same, and finally discloses a three-dimensional micro movement device configured by arranging the one-dimensional micro movement device in a three-dimension.

Linear Structure for Displacement Transmission

Figure 1:
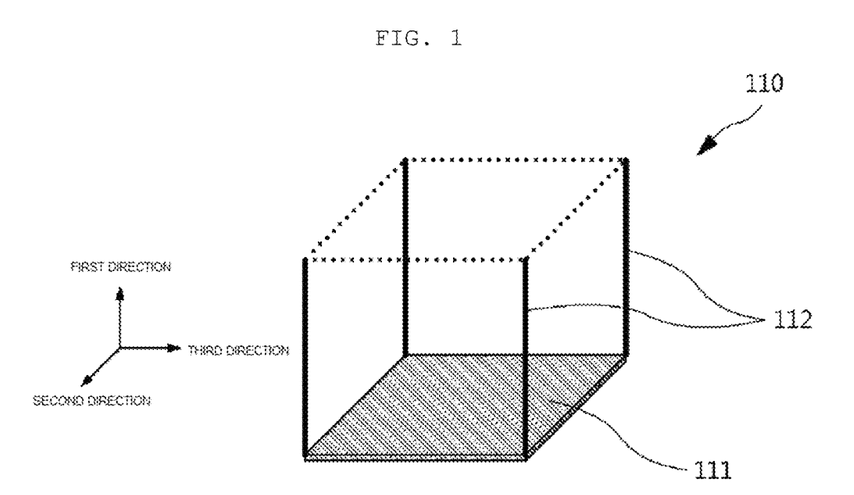
FIG. 1 shows an example of a linear structure for displacement transmission according to the present invention.

When a detailed design specification of the structure for satisfying the conditions as described above is considered, the linear structure for displacement transmission may be a structure in which a minor transition of the driving part is directly transmitted to the moving part in a first direction and spring constants in a second direction and a third direction which are perpendicular to the first direction are formed to be negligibly small such that the moving part moves without affecting the first direction when the moving part is moved in the second and third directions. That is, the structure for displacement transmission may be a structure in which it is bent in the second direction or the third direction when force in the second direction or the third direction is applied to the structure for displacement transmission from the outside, and directly transmits a displacement in the first direction from an end of one side to an end of the other side when the force in the first direction is applied. Of course, the structure described above has already been variously implemented even with the flexure structure discussed above, but the flexure structure has the problems that the structure is complex, the machining process is difficult, a machining cost is expensive, the inter-axis interference occurs, and the dynamic characteristic is deteriorated. Therefore, the present invention suggests a new structure as shown in FIG. 1. FIG. 1 shows an example of a linear structure for displacement transmission according to the present invention. As shown, a linear structure 110 for displacement transmission according to the present invention includes a displacement transmission plate 111 and a plurality of displacement transmission rods 112.

Figure 2:
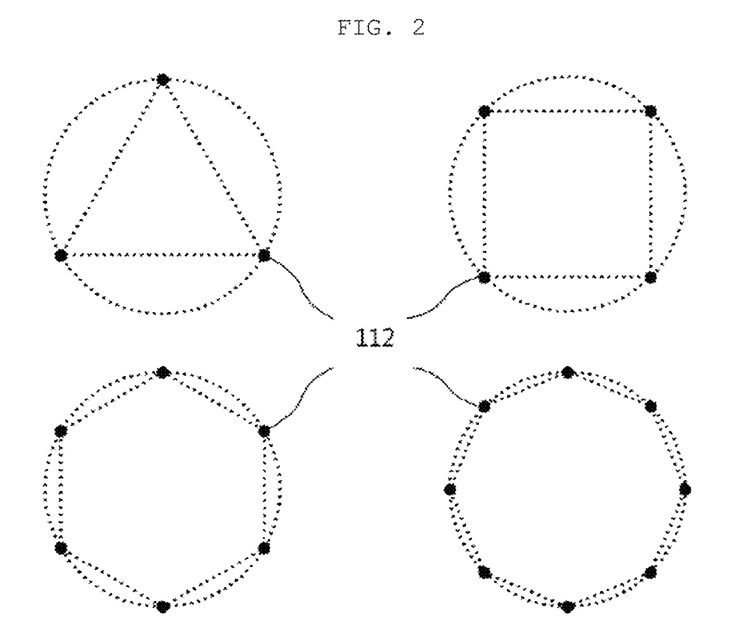
FIG. 2 shows various examples of an arrangement of a displacement transmission rod of the linear structure for displacement transmission according to the present invention.

The displacement transmission plate 111 is formed in a surface shape and is disposed on a plane in the second direction and the third direction, and the displacement transmission rods 112 are formed in a linear shape in which they extend in the first direction and have ends of one side connected to the displacement transmission plate 111. Here, the displacement transmission plate 111 need not be the surface shape or a shape in which the entire surface is filled, but the remaining portion may be hollow or connected to each other in a linear structure except for the portion supporting the displacement transmission rods 112. In this case, the plurality of displacement transmission rods 112 are disposed radially on the displacement transmission plate 111 and transmit a displacement in the first direction from an end of one side to an end of the other side. FIG. 2 shows various examples of an arrangement of a displacement transmission rod of the linear structure for displacement transmission according to the present invention. As shown, the displacement transmission rods 112 are disposed radially on a plane in the second direction and the third direction, thereby making it possible to uniformly transmit a displacement and a pressure in the first direction.

Figure 3:
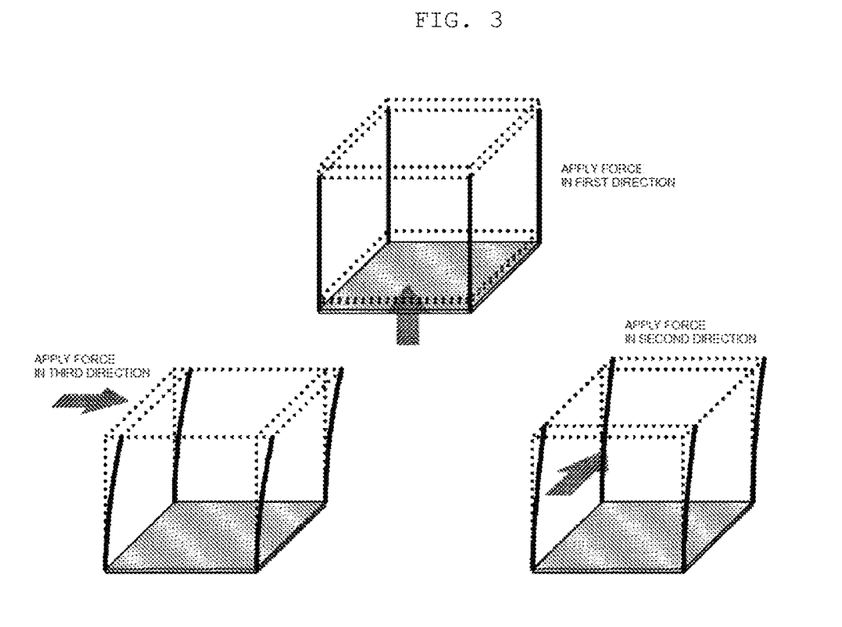
FIG. 3 shows an operation example of the linear structure for displacement transmission according to the present invention.

FIG. 3 shows an operation example of the linear structure for displacement transmission according to the present invention. As described above, the linear structure 110 of displacement transmission according to the present invention needs to be able to transmit the displacement in the first direction without distortion. As shown in a drawing of an upper portion of FIG. 3, if force in a first direction is applied to the displacement transmission plate 111, a displacement in the first direction is generated in the displacement transmission plate 111. In this case, since the displacement transmission rods 112 in which ends of one side are connected to the displacement transmission plate 111 are all a linear shape in which they extend in the first direction, a displacement in the first direction is naturally generated at the ends of the other side of the displacement transmission rods 112 by the same displacement as the displacement transmission plate 111. That is, the displacement applied to the displacement transmission plate 111 is well transmitted to the ends of the other side of the displacement transmission rods 112 without distortion.

Meanwhile, as shown in two drawings of a lower portion of FIG. 3, if force in the second direction or the third direction is applied to the displacement transmission rods 112, the displacement transmission rods 112 are bent in the second direction or the third direction. In particular, since the transmission rods 112 are formed in the linear shape in which they extend in the first direction, when the force is applied in the first direction, a shape of the displacement transmission rods 112 is not deformed and the displacement in the first direction is transmitted from the ends of one side to the ends of the other side, but when the force in the second direction or the third direction is applied, the displacement transmission rods 112 are easily deformed. That is, a spring constant in the second direction or the third direction is much smaller than the spring constant in the first direction.

As described above, the reason for adopting the structure that the shape may not be deformed in the first direction, the displacement may be transmitted without distortion, and the shape deformation may be made very easily in the second direction and the third direction is as follows. As described above, a linear structure 110 for displacement transmission according to the present invention ultimately implements a micro movement in a three-dimensional direction. Here, it is assumed that three linear structures 110 for displacement transmission are connected to one moving part and are disposed so that the respective first directions are parallel to three direction of X, Y, and Z. Here, in a case in which a displacement is transmitted to the moving part through [a linear structure for displacement transmission disposed so that the first direction is parallel to an X axis direction (which is referred to as 'an X axis direction linear structure')], the moving part is moved in the X axis direction by the transmitted displacement. However, the moving part is also connected to [a linear structure for displacement transmission disposed so that the first direction is parallel to a Y axis direction (which is referred to as 'a Y axis direction linear structure')], and is also connected to [a linear structure for displacement transmission disposed so that the first direction is parallel to a Z axis direction (which is referred to as 'a Z axis direction linear structure')]. When the moving part is moved in the X axis direction by the X axis direction linear structure, the force is applied in the first direction from a viewpoint of the X axis direction linear structure, but the force is applied in the second direction or the third direction from the viewpoint of the Y axis direction linear structure or the Z axis direction linear structure. In this case, if a spring constant of the Y axis direction linear structure or the Z axis direction linear structure in the second direction or the third direction thereof is large, the movement of the moving part in the X axis direction causes resistance, and due to the above-mentioned resistance, the displacement transmitted by the X axis direction linear structure is not transmitted to the moving part without distortion and the distortion such as a reduction of a displacement value occurs. On the other hand, if the spring constant of the Y axis direction linear structure or the Z axis direction linear structure in the second direction or the third direction thereof is sufficiently small, the movement of the moving part in the X axis direction hardly causes the resistance and displacement transmission distortion error due to the resistance does not occur. That is, a three-dimensional micro movement may be implemented well through the structure as described above.

The linear structure 500 for displacement transmission may be a conceptually similar structure to the flexure structure in which the spring constant in the other direction is much smaller than the spring constant in the specific direction, such that when the force is applied from the outside, a shape deformation in the specific direction is limited and only the shape deforming in the other direction occurs to thereby guide the motion. However, since the flexure structure is mainly used to guide the motion in a direction in which the spring constant is small while the linear structure for displacement transmission according to the present invention is mainly used to transmit the displacement in a direction in which the spring constant is large, applications thereof are different from each other.

In addition, in the case of various flexure structures which is generally well used, it may be well seen that the flexure structure is formed in a shape in which thin cutting lines are formed in one large block. As may be intuitively seen from this shape, the flexure structure has a problem that it is very disadvantageous in realizing miniaturization and weight lightening because one large block itself has basically significant weight and volume. However, according to the present invention, as may be intuitively seen from FIGS. 1 to 3, since the linear structure for displacement transmission includes the displacement transmission plate 111 of a thin surface form and the displacement transmission rods 112 of a thin line form, there is an advantage that miniaturization and weight lightening may be much effectively implemented as compared to the conventional flexure structure.

Meanwhile, in order to allow the resistance in the second direction and the third direction to be made negligibly small while transmitting the displacement in the first direction without distortion, a length of the displacement transmission rod 112 is made much larger than an equivalent diameter of a cross section thereof (here, the reason that 'the equivalent diameter of the cross section' is used is that a shape of the cross section may be various shapes such as a circle and a square). In addition, in a case in which the displacement in the first direction is too large, since a plastic deformation in which the displacement transmission rods 112 are fully bent may be caused, it is preferable that the magnitude of the displacement transmitted in the first direction is also limited to some extent.

Specifically, in the linear structure 110 for displacement transmission according to the present invention, it is preferable that a ratio of the equivalent diameter of the cross section to the length of the displacement transmission rod 112 is within the range of 1 to 10%, and more specifically, it is preferable that the length of the displacement transmission rod 112 is within the range of several to several tens mm. In addition, it is preferable that the displacement transmitted by the linear structure 110 for displacement transmission is within the range of 0.001 to 1% of the length of the displacement transmission rod 112. The applicant has successfully performed an experiment of transmitting a displacement of 10 μm without distortion using the displacement transmission rod 112 having a square cross section of 0.3 mm×0.3 mm and a length of 9 mm.

In addition, the displacement transmission rod 112 may be formed in various forms such as a rod shape in which an interior is tightly filled, a pipe shape in which an interior is empty, and a spring. In a case in which the displacement transmission rod 112 is formed in the rod shape in which the interior is tightly filled, rigidity of the structure may be increased, but the weight thereof may be somewhat increased, and in a case in which the displacement transmission rod 112 is formed in the pipe shape in which the interior is empty, the rigidity of the structure may be slightly decreased but the weight of the structure may be further reduced. In addition, in a case in which the displacement transmission rod 112 is formed in the spring, the linear structure 110 for displacement transmission itself may act as a line spring.

Meanwhile, as described above, since the linear structure 110 for displacement transmission are easily bent in the second direction and the third direction, it is basically formed in a structure having significantly weak rigidity in the second direction and the third direction. However, if the rigidity in the second direction and the third direction is excessively weak, there is a risk that error occurs in the transmission of the displacement in the first direction by the distortion due to an unwanted deformation in the second direction or the third direction. In order to prevent the above-mentioned problem, it is desirable to reinforce the rigidity of the linear structure 110 for displacement transmission. In addition, when it is assumed that it is known in advance that there is some device to transmit the displacement in the first direction, and noise force that may induce the distortion frequently comes in the second direction in the use environment, while this external noise force hardly occurs in the third direction, it is desirable to further increase the spring constant in the second direction so as to reduce the influence of the external noise in the second direction.

As described above, the linear structure 110 for displacement transmission may further include stiffeners 113 formed between the plurality of displacement transmission rods 112 so that the rigidity of the linear structure 110 for displacement transmission is reinforced or the spring constant in a predetermined specific direction is increased. FIG. 4 shows various examples of a stiffener of the linear structure for displacement transmission according to the present invention.

A drawing on the left of FIG. 4 shows a case in which a plurality of stiffeners are formed in a linear shape and are disposed to be parallel to each other. In a case in which the stiffeners 113 are provided in the above-mentioned form, displacement transmission property may be further increased, and a distorted displacement of the moving part or an angle change deviated from a parallel movement may be suppressed.

A drawing on the right of FIG. 4 shows a case in which a plurality of stiffeners are formed in a linear shape and are disposed in an X shape. In a case in which the stiffeners 113 are disposed as described above, an effect such as an improvement of displacement transmission property, the suppression of the distorted displacement and the angle change, and the like may also be increased, and supporting force, that is, rigidity may be further increased as compared to the drawing on the left of FIG. 4. In particular, in the case of the drawing on the right of FIG. 4, the rigidity in the direction in which the X shaped stiffener is more reinforced than the rigidity in other directions, thereby making it possible to implement the reinforcement of the rigidity in a specific direction. However, in this case, since a scan to a surface on which the X shaped stiffener is disposed is limited as much as the rigidity is reinforced, it is preferable that this case is applied to a case in which the scanner is limited to a two-axis scanner.

In a similar way to the arrangement of the X-shaped stiffeners in the drawing on the right of FIG. 4, the stiffeners 113 may be formed in a surface shape and may also be provided between at least one pair of displacement transmission rods 112 selected from the plurality of displacement transmission rods 112. By doing as described above, the rigidity in the specific direction may be maximally reinforced.

One-Dimensional Micro Movement Device Using Linear Structure for Displacement Structure Hereinafter, a configuration of a one-dimensional micro movement device according to the present invention that implements a movement in a first direction using the linear structure for displacement transmission as described above with reference to FIGS. 1 to 4 will be described in detail.

Figure 5:
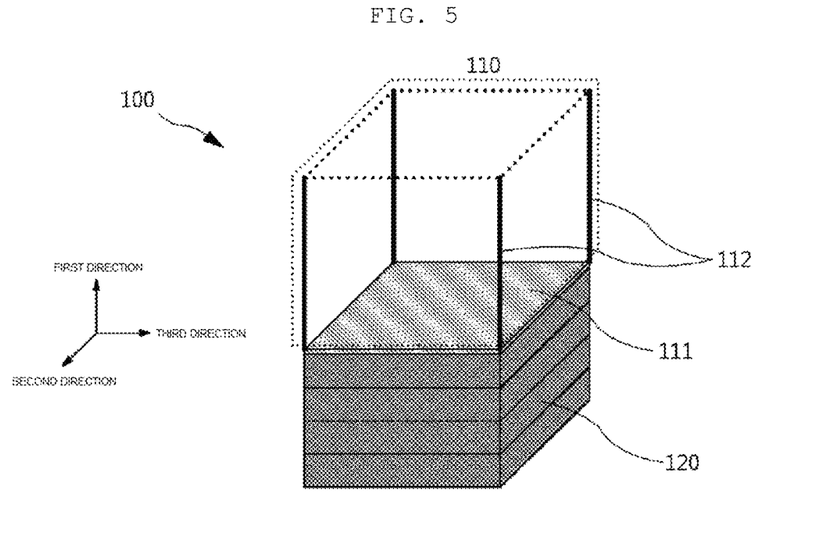
FIG. 5 shows an example of a one-dimensional micro movement device according to the present invention.

FIG. 5 shows an example of a one-dimensional micro movement device according to the present invention. As shown, a one-dimensional micro movement device 100 according to the present invention includes the linear structure 110 for displacement transmission as described above and a driving part 120 deformed to be stretched and contracted in the first direction. The driving part 120 will be described in more detail. An upper surface and a lower surface of the driving part 120 are disposed to be parallel to the plane in the second direction and the third direction and any one surface of the upper surface and the lower surface forms a fixing end and the other surface forms a moving end, such that the driving part 120 is deformed to be stretched and contracted in the first direction with respect to the fixing end, thereby generating a displacement in the first direction in the moving end. In this case, the linear structure 110 for displacement transmission is provided to the moving end of the driving part 120, such that the displacement in the first direction generated from the driving part 120 may be transmitted to an end of the other side of the linear structure 110 for displacement transmission. That is, if a certain object to be moved, that is, the moving part is put on the end of the other side of the linear structure 110 for displacement transmission, the displacement applied from the driving part 120 is well transmitted to the moving part without distortion, thereby making it possible to implement the one-dimensional micro movement well.

An actual implementation of the driving part 120 will be described in more detail. The driving part 120 may be any driver capable of realizing precise and delicate movement in the first direction. A representative example of the driver as described above includes a piezoelectric actuator, and in various drawings of the present invention, the driving part 120 is shown as the piezoelectric actuator. However, the driving part 120 is not necessarily limited to the piezoelectric actuator, but may also be formed of, for example, a device such as an electromagnet driver. When the driving part 120 is formed of the electromagnet driver, a magnetic substance may be included in the displacement transmission plate 111 from which the motion needs to be generated, or the displacement transmission plate 111 itself may be formed of a magnetic material.

Figure 6:
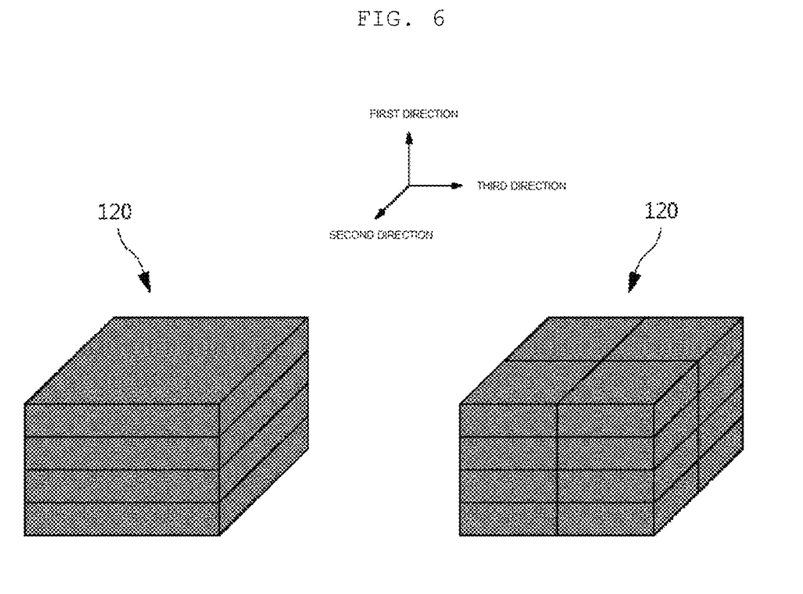
FIG. 6 shows various examples of a driving part of the one-dimensional micro movement device according to the present invention.

FIG. 6 shows various examples of a driving part of the one-dimensional micro movement device according to the present invention and shows various examples of a case in which the driving part 120 is the piezoelectric actuator. The driving part 120 may be formed of a single piezoelectric element, but is preferably formed in a form in which a plurality of piezoelectric elements are stacked as shown in a drawing on the left to increase the displacement. In addition, as shown in a drawing on the right of FIG. 6, the driving part 120 may also be formed by arranging a plurality of piezoelectric elements stretched and contracted in the first direction to be parallel to each other on the plane in the second direction and the third direction. By doing as described above, an area of the displacement transmission plate 111 may also be increased. Alternatively, the displacement transmission plate 111 is separately provided to each of the piezoelectric elements which are arranged to be parallel to each other and the displacement is differently applied to each of the piezoelectric elements which are arranged to be parallel to each other, thereby making it possible to realize more multidimensional movement control such as a generation of an accurate displacement in the first direction without displacement in the second direction or the third direction, or an application of a fine angle change to the moving part.

FIG. 7 shows another example of the one-dimensional micro movement device according to the present invention. The one-dimensional micro movement device 100 according to the exemplary embodiment of FIG. 7 further includes an auxiliary driving part 125 having a fixing end and a moving end which are disposed in a direction opposite to the driving part 120. In this case, the auxiliary driving part 125 may also be provided on an opposite surface of the driving part 120 with respect to the moving part provided to the end of the linear structure 110 for displacement transmission, or may also be formed so that the displacement transmission plate 111 is interposed between the driving part 120 and the auxiliary driving part 125.

Due to characteristics of a general piezoelectric element, a stretching speed is fast whereas a contracting speed is slow. In a case in which the driving part 120 is implemented as the piezoelectric actuator, operation efficiency of the driving part 120 may be lowered due to disadvantageous characteristics of the piezoelectric element. In this case, if the one-dimensional micro movement device 100 further includes the auxiliary driving part 125 which is implemented as the piezoelectric actuator and disposed in a direction opposite to the driving part 120, the driving part 120 compensates for the slow contracting speed with the fast stretching speed of the auxiliary driving part 125, thereby making it possible to improve response characteristics.

As briefly described above, in the case in which the driving part 120 is implemented as the electromagnet driver, the auxiliary driving part 125 may be used to balance force of the electromagnet or the like. In this case, since the motion may be implemented in a state in which the driving part and the displacement transmission plate are not in contact with each other, the scan may be performed without mechanical contact with the outside, thereby further suppressing inter-axis interference or blocking external vibration.

FIG. 8 shows another example of the one-dimensional micro movement device according to the present invention. The one-dimensional micro movement device 100 according to the exemplary embodiment of FIG. 8 further includes an elastic compressing part 130, which is an elastic body provided to the moving end of the driving part 120, and formed so that elastic force acts in a direction to compress the driving part 120 in the first direction. As described above in the exemplary embodiment of FIG. 7, the piezoelectric element has a trend in which the contracting speed is slower than the stretching speed, but the elastic compressing part 130 is provided to thereby reinforce force in the contracting direction by an action of the elastic force upon contracting the driving part 120. As a result, the contracting speed may be compensated and the response characteristics may also be improved.

Three-Dimensional Micro Movement Device Using One-Dimensional Micro Movement Device The linear structure for displacement transmission and the one-dimensional micro movement device using the same described above are to ultimately implement a three-dimensional micro movement. As described above in the paragraph [■ Linear Structure for Displacement Transmission] above, the three-dimensional micro movement may be more precisely and accurately implemented by disposing three-dimensionally a structure which may be bent in the second direction and the third direction without resistance while transmitting a micro movement displacement in the first direction without distortion.

FIG. 9 shows an example of a three-dimensional micro movement device according to the present invention. A three-dimensional micro movement device 500 according to the present invention includes a moving part 200 to which three one-dimensional micro movement devices 100 disposed in X, Y, and Z axis directions, respectively, are directly connected, and the moving part 200 is movable in the X, Y, and Z axis directions by the three one-dimensional micro movement devices 100. Although the drawing of FIG. 9 shows a case in which the one-dimensional micro movement devices 100 configuring the three-dimensional micro movement device 500 has the most basic form as shown in FIG. 5, the present invention is not limited thereto. That is, the one-dimensional micro movement devices 100 configuring the three-dimensional micro movement device 500 may be applied with any one of the various exemplary embodiments shown in FIGS. 5 to 8, and may also be differently applied to the X, Y, and Z axes, respectively. Further, the linear structure 110 for displacement transmission configuring the one-dimensional micro movement device 100 may also be applied with various exemplary embodiments as shown in FIG. 3 or 4.

FIG. 10 shows another example of the three-dimensional micro movement device according to the present invention. The three-dimensional micro movement device 500 according to the exemplary embodiment of FIG. 10 further includes a linear structure 300 for support. The linear structure 300 for support includes a plurality of supporting rods 310 connected to the displacement transmission plate 111 of at least one one-dimensional micro movement device 100 selected from the one-dimensional micro movement devices 100, extended in a direction perpendicular to a displacement transmission direction of the selected one-dimensional micro movement device 100, and formed in a linear shape. The linear structure 300 for support is provided, thereby making it possible to more effectively suppress an occurrence of the displacement in a direction other than a desired movement direction. Although the drawing shows that the supporting rods 310 are provided to be extended in an X axis direction and a Y axis direction of the displacement transmission plate 111, the supporting rods 310 may be variously modified. For example, the supporting rods 310 may be disposed radially for more stable suppression.

FIG. 11 shows another example of the one-dimensional micro movement device according to the present invention. The three-dimensional micro movement device 500 according to the exemplary embodiment of FIG. 11 includes at least one sensor 400 provided to the moving part 200 and sensing a displacement in at least one direction selected from the X, Y, and Z axis directions of the moving part 200. Preferably, it is best that the sensor 400 is provided for all three directions. As such, the sensor 400 is provided, such that the movement of the moving part 200 may be measured and controlled in real time, thereby making it possible to more precisely control a micro movement.

APPLICATION EXAMPLE

Figure 12:
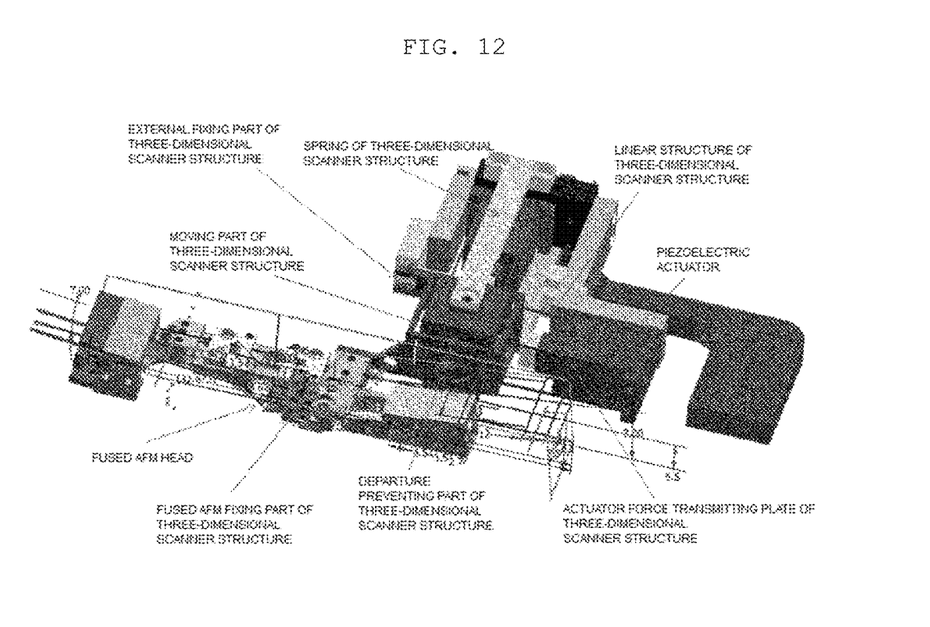
FIG. 12 shows an application example of the three-dimensional micro movement device according to the present invention.

FIG. 12 shows one of application examples of the three-dimensional micro movement device according to the present invention. In a fused AFM microscope, the scan may also be performed by moving a stage on which an observation objection is disposed, but in performing a fine range of scan, there is a limitation in driving precision of the stage or a weight/large area sample may not be measured. Accordingly, a scanner for micro movement for separately moving only a microscope head is separately provided. However, according to the related art, since a one-dimensional scanner and a two-dimensional scanner are provided to be stacked, there are problems that a decrease in a resonance frequency and a deterioration of a scan speed limit due to an increase in an effective weight of the stacked scanner.

However, as shown in FIG. 12, if the three-dimensional micro movement device according to the present invention is applied as a three-dimensional scanner of the microscope head, the problem according to the related art may be solved at one time. That is, since the three-dimensional micro movement device may be miniaturized, weight-lightened, easily manufactured, and save the cost, the problem of the reduction of the resonance frequency and the deterioration of the scan speed limit as described above may be solved.

In FIG. 12, the three-dimensional micro movement device according to the present invention is employed as a three-dimensional scanner of the microscope head, and an external fixing part serving to hold the scanner so that the scanner is not warped when force is applied to the three-dimensional scanner such as adjusting the head, and a departure preventing part preventing damage of the linear structure by the moving part which is tilted or departed from in situ are further provided, thereby implementing more stable control.

The example of FIG. 12 is an example in which the three-dimensional micro movement device according to the present invention is applied to an AFM microscope head, but the three-dimensional micro movement device according to the present invention may be applied to various fields. As shown in FIG. 12, a real-time imaging may also be implemented by using the three-dimensional micro movement device as a real-time scanner in a scanning microscope such as AFM, STM, or the like. By applying the three-dimensional micro movement device to a sample scan of an electron/ion beam microscope such as SEM/FIB or the like, three-dimensional imaging capability may be provided as compared to an existing two-dimension imaging, it is possible to implement a high resolution scan which is difficult to achieve with the conventional electron/ion beam scanner, and since an electron/ion beam does not directly scan, the electron/ion beam microscope may be more easily manufactured and may also be miniaturized. In addition, even though it is limited to small specimens, the three-dimensional micro movement device may also be applied to CD-SEM because it is possible to implement the three-dimensional imaging. As well, by reducing the head or applying the three-dimensional micro movement device to a small sample, the three-dimensional micro movement device may also be utilized in a scanner of a micro machining device such as a micro 3D printer or the like. As described above, the three-dimensional micro movement device may be variously applied to all fields in which a moving object of a small size and a lightweight is to be precisely moved in the three-dimensional direction.

Figure 13:
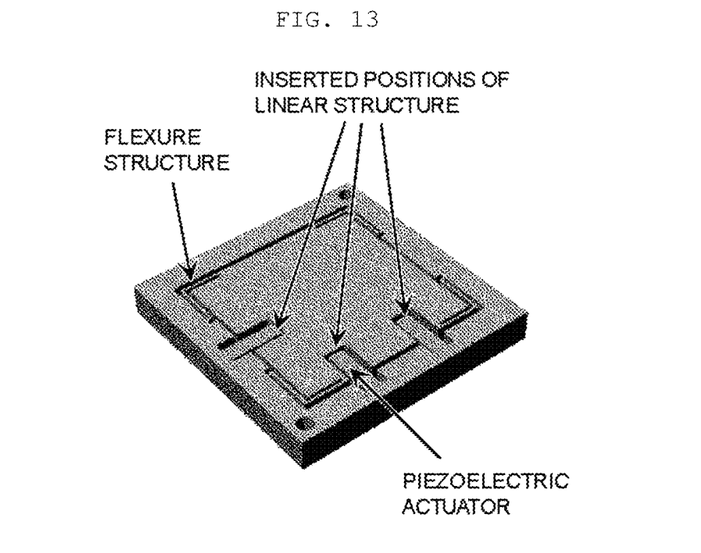
FIG. 13 shows an application example of the linear structure for displacement transmission according to the present invention.

FIG. 13 shows one of the application examples of the linear structure for displacement transmission according to the present invention. According to the exemplary embodiment of FIG. 13, as compared to the conventional flexure structure, the linear structure for displacement transmission according to the present invention is provided to a portion to which the piezoelectric actuator is provided. In the structure of FIG. 13, in a case in which there is no linear structure for displacement transmission according to the present invention, that is, in the conventional case, when the moving part moves, significant friction and resistance are generated between an actuator which is responsible for an axis perpendicular to a moving axis and the moving part. On the other hand, if the linear structure for displacement transmission according to the present invention is applied as a connection structure of the piezoelectric actuator and the moving part (in this case, the piezoelectric actuator included in the flexure structure and the linear structure for displacement transmission according to the present invention are coupled to each other to thereby form the one-dimensional micro movement device according to the present invention), when the moving part moves, friction and resistance between the actuator which is responsible for the axis perpendicular to the moving axis and the moving part may be significantly reduced. Therefore, various advantageous effects may be obtained such as an increase in a dynamic response speed of the moving part, a reduction in inter-axis interference, and the like.

The present invention is not limited to the above-mentioned exemplary embodiments but may be variously applied, and may be variously modified by those skilled in the art to which the present invention pertains without departing from the gist of the present invention claimed in the claims.

INDUSTRIAL APPLICABILITY

According to the present invention, as the three-dimensional micro movement device having excellent dynamic characteristics and small size and light weight is realized, the three-dimensional micro movement device is applied to a head of a device having a small head used for observation or machining, such as a scanning microscope such as AFM, STM, or the like, an electron/ion beam microscope such as SEM/FIB, or the like, a micro machining device such as a micro 3D printer, or the like, or more fine and precise scan is implemented for a small sample, thereby making it possible to realize more fine and precise observation or machining

The invention claimed is:

1. A linear structure for displacement transmission in which a spring constant in a second direction and a third direction which are perpendicular to a first direction is smaller than the spring constant in the first direction such that the linear structure for displacement transmission is bent in the second direction or the third direction when force in the second direction or the third direction is applied and transmits a displacement in the first direction from an end of one side to an end of the other side when force in the first direction is applied, the linear structure for displacement transmission comprising:
   a displacement transmission plate formed in a surface shape and disposed on a plane in the second direction and the third direction; and
   a plurality of displacement transmission rods formed in a linear shape extended in the first direction and having ends of one side connected to the displacement transmission plate,
   wherein the plurality of displacement transmission rods are disposed radially on the displacement transmission plate to transmit the displacement in the first direction from the end of one side to the end of the other side.

2. The linear structure for displacement transmission of claim 1, wherein the linear structure for displacement transmission is formed so that a ratio of an equivalent diameter of a cross section to a length of the displacement transmission rod is within the range of 1 to 10%, and the displacement transmitted by the linear structure for displacement transmission is within the range of 0.001 to 1% of the length of the displacement transmission rod.

3. The linear structure for displacement transmission of claim 2, wherein the length of the displacement transmission rod is within the range of several to several tens mm.

4. The linear structure for displacement transmission of claim 1, wherein the displacement transmission rod is formed in at least one form selected from a rod shape in which an interior is tightly filled, a pipe shape in which an interior is empty, and a spring.

5. The linear structure for displacement transmission of claim 1, further comprising a stiffener formed between the plurality of displacement transmission rods so that rigidity of the linear structure for displacement transmission is reinforced or the spring constant in a predetermined specific direction is increased.

6. The linear structure for displacement transmission of claim 5, wherein a plurality of stiffeners are formed in a linear shape and are disposed to be parallel to each other or disposed in an X shape, or are formed in a surface shape and are provided between at least one pair of displacement transmission rods selected from the plurality of displacement transmission rods.

7. A one-dimensional micro movement device comprising:

the linear structure for displacement transmission of claim 1; and a driving part having an upper surface and a lower surface which are disposed to be parallel to a plane in a second direction and a third direction and deformed to be stretched and contracted in a first direction by forming any one surface selected from the upper surface and the lower surface as a fixing end and forming the other surface as a moving end, wherein the linear structure for displacement transmission is provided to the moving end of the driving part.

8. The one-dimensional micro movement device of claim 7, wherein the driving part is formed of a piezoelectric actuator or an electromagnet driver.

9. The one-dimensional micro movement device of claim 7, wherein the driving part is formed by arranging a plurality of piezoelectric elements which are stretched and contracted in the first direction to be parallel to each other on a plane of the second direction and the third direction.

10. The one-dimensional micro movement device of claim 7, further comprising an auxiliary driving part having a fixing end and a moving end which are disposed in a direction opposite to the driving part.

11. The one-dimensional micro movement device of claim 10, wherein the one-dimensional micro movement device is formed so that the displacement transmission plate is interposed between the driving part and the auxiliary driving part.

12. The one-dimensional micro movement device of claim 7, further comprising an elastic compressing part, which is an elastic body provided to the moving end of the driving part, and formed so that elastic force acts in a direction to compress the driving part in the first direction.

13. A three-dimensional micro movement device including the one-dimensional micro movement device of claim 7, the three-dimensional micro movement device comprising:

three one-dimensional micro movement devices disposed in X, Y, and Z axis directions, respectively; and a moving part to which the three one-dimensional micro movement devices are connected, wherein the moving part is movable in the X, Y, and Z axis directions by the three one-dimensional micro movement devices.

14. The three-dimensional micro movement device of claim 13, further comprising a linear structure for support including a plurality of supporting rods connected to the displacement transmission plate of at least one one-dimensional micro movement device selected from the one-dimensional micro movement devices, extended in a direction perpendicular to a displacement transmission direction of the selected one-dimensional micro movement device, and formed in a linear shape.

15. The three-dimensional micro movement device of claim 13, further comprising at least one sensor provided to the moving part and sensing a displacement in at least one direction selected from the X, Y, and Z axis directions of the moving part.

* * * * *